(12) United States Patent
Demharter

(10) Patent No.: US 10,436,868 B2
(45) Date of Patent: Oct. 8, 2019

(54) SIGNAL PROCESSING IN A MAGNETIC RESONANCE TOMOGRAPHY DEVICE

(71) Applicant: Nikolaus Demharter, Dormitz (DE)

(72) Inventor: Nikolaus Demharter, Dormitz (DE)

(73) Assignee: Siemens Aktiengesellschaft, München (DE)

( * ) Notice: Subject to any disclaimer, the term of this patent is extended or adjusted under 35 U.S.C. 154(b) by 620 days.

(21) Appl. No.: 14/828,646

(22) Filed: Aug. 18, 2015

(65) Prior Publication Data

US 2016/0054413 A1 Feb. 25, 2016

(30) Foreign Application Priority Data

Aug. 19, 2014 (DE) ........................ 10 2014 216 402

(51) Int. Cl.
| | | |
|---|---|---|
| *G01V 3/00* | (2006.01) | |
| *G01R 33/54* | (2006.01) | |
| *G01R 33/48* | (2006.01) | |
| *G01R 33/36* | (2006.01) | |

(52) U.S. Cl.
CPC ....... *G01R 33/543* (2013.01); *G01R 33/3607* (2013.01); *G01R 33/3621* (2013.01); *G01R 33/3671* (2013.01); *G01R 33/482* (2013.01); *G01R 33/4816* (2013.01); *G01R 33/4818* (2013.01); *G01R 33/4822* (2013.01); *G01R 33/4824* (2013.01); *G01R 33/4826* (2013.01); *G01R 33/4828* (2013.01)

(58) Field of Classification Search
CPC ............ G01R 33/4816; G01R 33/4818; G01R 33/482; G01R 33/4822; G01R 33/4824; G01R 33/4826; G01R 33/4828; G01R 33/483; G01R 33/4831; G01R 33/4833; G01R 33/4835; G01R 33/4836; G01R 33/4838
USPC ................................................. 324/300–322
See application file for complete search history.

(56) References Cited

U.S. PATENT DOCUMENTS

| | | | |
|---|---|---|---|
| 6,977,502 B1 | 12/2005 | Hertz | |
| 2005/0127914 A1 | 6/2005 | Eberler et al. | |
| 2006/0103386 A1* | 5/2006 | Buchwald | G01R 33/3621 324/322 |
| 2007/0001672 A1* | 1/2007 | Patch | G01R 33/561 324/307 |
| 2007/0224698 A1 | 9/2007 | Jesmanowicz | |

(Continued)

FOREIGN PATENT DOCUMENTS

| | | |
|---|---|---|
| DE | 10314215 B4 | 11/2006 |
| DE | 102013201724 A1 | 8/2014 |

OTHER PUBLICATIONS

German Office Action for related German Application No. 10 2014 216 402.8, dated May 7, 2015, with English Translation.

(Continued)

*Primary Examiner* — Giovanni Astacio-Oquendo
*Assistant Examiner* — Raul J Rios Russo
(74) *Attorney, Agent, or Firm* — Lempia Summerfield Katz LLC

(57) ABSTRACT

A magnetic resonance tomography system includes a computer configured to implement signal processing of transmit signals and/or receive signals. The signal processing is configured to implement a mixer, an upsampler, a decimator, a filter, or any combination thereof.

13 Claims, 3 Drawing Sheets

(56) References Cited

U.S. PATENT DOCUMENTS

| | | | | |
|---|---|---|---|---|
| 2008/0063247 A1* | 3/2008 | Griswold | ............. | G01R 33/561 |
| | | | | 382/128 |
| 2012/0313813 A1* | 12/2012 | Brooks | ................... | G01S 7/20 |
| | | | | 342/159 |
| 2013/0119982 A1* | 5/2013 | Pirkl | ................. | G01R 33/3621 |
| | | | | 324/309 |
| 2013/0261429 A1* | 10/2013 | Lee | ....................... | A61B 5/055 |
| | | | | 600/411 |
| 2014/0066745 A1* | 3/2014 | Campagna | ............. | A61B 5/055 |
| | | | | 600/407 |
| 2015/0219737 A1* | 8/2015 | Fenchel | ................. | A61B 5/055 |
| | | | | 600/411 |
| 2016/0054416 A1* | 2/2016 | Stehning | ................ | A61B 5/055 |
| | | | | 600/411 |
| 2017/0108569 A1* | 4/2017 | Harvey | ............. | G01R 33/5659 |

OTHER PUBLICATIONS

German Office Action for related German Application No. 10 2014 216 402.8 dated May 22, 2017.

* cited by examiner

SIGNAL PROCESSING IN A MAGNETIC RESONANCE TOMOGRAPHY DEVICE

This application claims the benefit of DE 102014216402.8, filed on Aug. 19, 2014, which is hereby incorporated by reference in its entirety.

FIELD

The disclosed embodiments relate to apparatuses and methods for signal processing in a magnetic resonance tomography device.

BACKGROUND

Magnetic resonance devices (MRTs) for examining objects or patients using magnetic resonance tomography are known for example from DE 10 314 215 B4.

SUMMARY

The scope of the present invention is defined solely by the appended claims and is not affected to any degree by the statements within this summary.

The present embodiments may obviate one or more of the drawbacks or limitations in the related art. For example, the disclosed embodiments may provide signal processing in a magnetic resonance tomography device.

DETAILED DESCRIPTION

Figure 3:
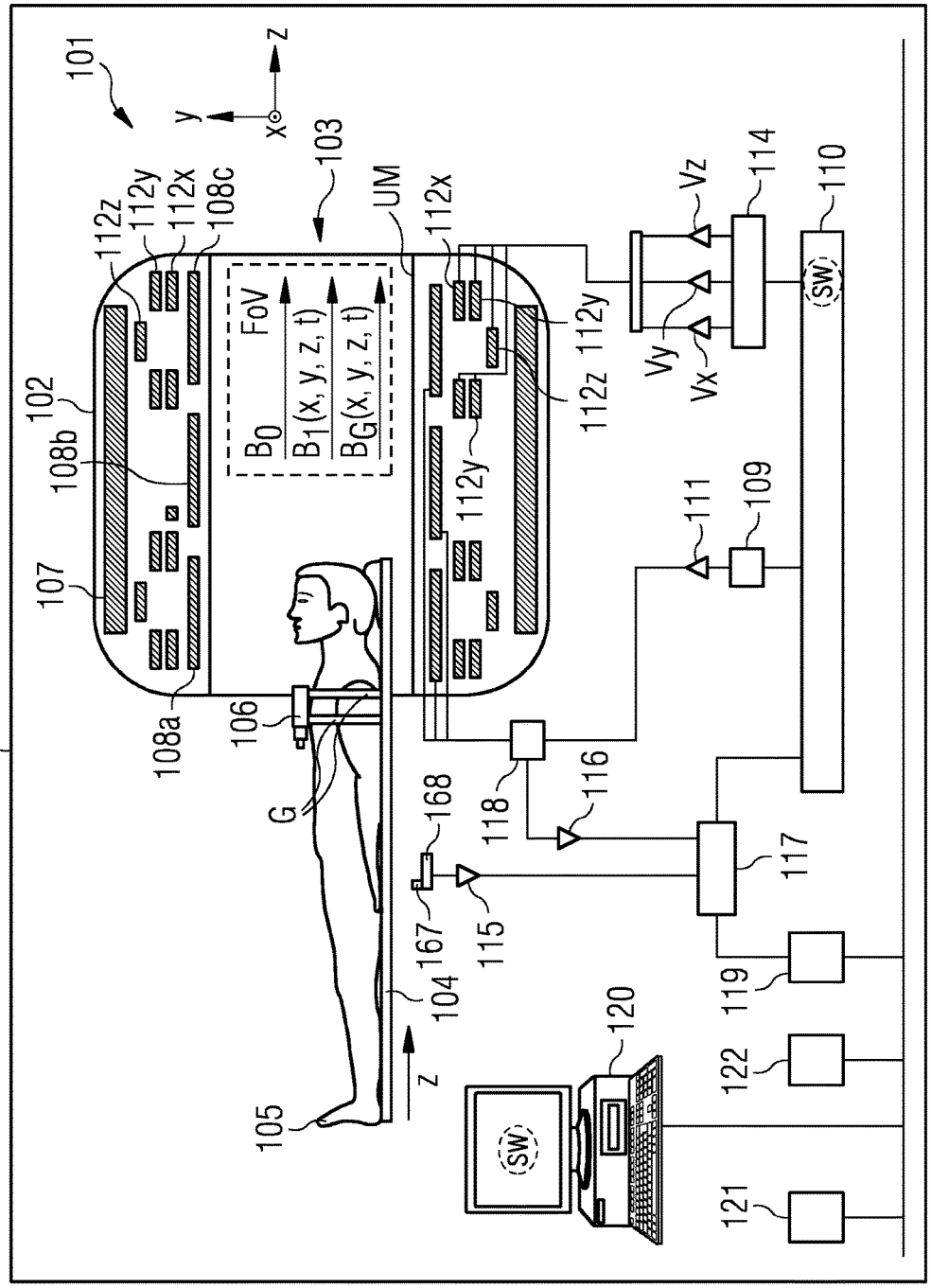
FIG. 3 shows a schematic and simplified illustration of a magnetic resonance tomography device in accordance with one example.

FIG. 3 shows an imaging magnetic resonance device (MRT) 101 (contained in a shielded room or Faraday cage F) including a hollow cylinder 102 having, in this case, a tubular bore 103 into which a patient couch 104 bearing a body, e.g., of an examination object (e.g., a patient) 105 (with or without local coil arrangement 106) is introduced in the direction of the arrow z so that images of the patient 105 may be generated via an imaging method. Disposed on the patient is a local coil arrangement 106, which may be used in a local region (also referred to as field of view or FOV) of the magnetic resonance device to generate images of a subregion of the body 105 in the FOV. Signals of the local coil arrangement 106 may be evaluated (e.g., converted into images, stored or displayed) by an evaluation device (168, 115, 117, 119, 120, 121, etc.) of the magnetic resonance device 101, which may be connected to the local coil arrangement 106, e.g., via coaxial cable or wirelessly (167), etc.

When a magnetic resonance device MRT 101 is used in order to examine a body 105 (an examination object or a patient) via magnetic resonance imaging, different magnetic fields which are coordinated with one another with the utmost precision in terms of their temporal and spatial characteristics are radiated onto the body 105. A strong magnet (often a cryomagnet 107) in a measurement chamber having, in this case, a tunnel-shaped bore 103 generates a strong static main magnetic field $B_0$ ranging, e.g., from 0.2 Tesla to 3 Tesla or more. A body 105 that is to be examined, supported on a patient couch 104, is moved into a region of the main magnetic field $B_0$, which is approximately homogeneous in the area of observation FOV. The nuclear spins of atomic nuclei of the body 105 are excited by way of magnetic radio-frequency excitation pulses $B_1(x, y, z, t)$, which are emitted via a radio-frequency antenna (and/or a local coil arrangement if warranted), which is depicted in simplified form as a body coil 108 (e.g., multipart=108a, 108b, 108c). Radio-frequency excitation pulses are generated, e.g., by a pulse generation unit 109, which is controlled by a pulse sequence control unit 110. Following amplification via a radio-frequency amplifier 111, the pulses are directed to the radio-frequency antenna 108. The radio-frequency system shown in FIG. 3 is indicated schematically. Often more than one pulse generation unit 109, more than one radio-frequency amplifier 111 and a plurality of radio-frequency antennas 108a, b, c are used in a magnetic resonance device 101.

The magnetic resonance device 101 also has gradient coils $112x$, $112y$, $112z$ via which magnetic gradient fields $B_G(x, y, z, t)$ are radiated in the course of a measurement in order to provoke selective layer excitation and for spatial encoding of the measurement signal. The gradient coils $112x$, $112y$, $112z$ are controlled by a gradient coil control unit 114 (and if appropriate by amplifiers Vx, Vy, Vz) which, like the pulse generation unit 109, is connected to the pulse sequence control unit 110.

Signals emitted by the excited nuclear spins (of the atomic nuclei in the examination object) are received by the body coil 108a, b, c and/or at least one local coil arrangement 106, amplified by assigned radio-frequency preamplifiers 116 and further processed and digitized by a receive unit 117. The recorded measurement data is digitized and stored in the form of complex numeric values in a k-space matrix. An associated MR image can be reconstructed from the value-filled k-space matrix via a multidimensional Fourier transform.

For a coil operated in both transmit and receive mode, for example, the body coil 108 or a local coil 106, correct signal forwarding is regulated by an upstream duplexer 118.

From the measurement data, an image processing unit 119 generates an image displayed to a user via an operator console 120 and/or stored in a memory unit 121. A central computer unit 122 controls the individual system components.

In MR tomography, images having a high signal-to-noise ratio (SNR) are usually acquired via local coil arrangements (coils, local coils). These are antenna systems that are mounted in immediate proximity to (on (anterior) or under (posterior)) or on or in the body 105. In the course of an MR measurement, the excited nuclei induce a voltage in the individual antennas of the local coil, which voltage is then amplified by a low-noise preamplifier (e.g. LNA, preamp) and finally forwarded to the receive electronics. So-called high-field systems (1.5 T-12 T or more) are used to improve the signal-to-noise ratio, even with high-resolution images. If more individual antennas may be connected to an MR receive system than there are receivers present, a switching matrix (also referred to as RCCS) for example is incorporated between receive antennas and receivers. The switching matrix routes the currently active receive channels (in most cases those currently lying in the magnet's field of view) to the receivers present. This enables more coil elements to be connected than there are receivers available, because in the case of whole-body coverage only those coils located in the FOV are read out or, as the case may be, only those located in the homogeneity volume of the magnet.

The term local coil arrangement 106 serves generally to describe e.g. an antenna system that includes, e.g., one antenna element or of a plurality of antenna elements (e.g., coil elements) configured as an array coil. These individual antenna elements are embodied for example as loop antennas (loops), butterfly coils, flex coils or saddle coils. A local coil arrangement includes, e.g., coil elements, a preamplifier, further electronics (standing wave traps, etc.), a housing, supports, and in some cases a cable with plug-type connector via which the local coil arrangement is connected to the MRT system. A receiver 168 mounted on the MRT system side filters and digitizes a signal received e.g. wirelessly, etc. by a local coil 106 and passes the data to a digital signal processing device, which in some cases derives an image or a spectrum from the data acquired via a measurement and makes it available to the user, e.g., for subsequent diagnosis by the user and/or for storage in a memory.

Figure 1:
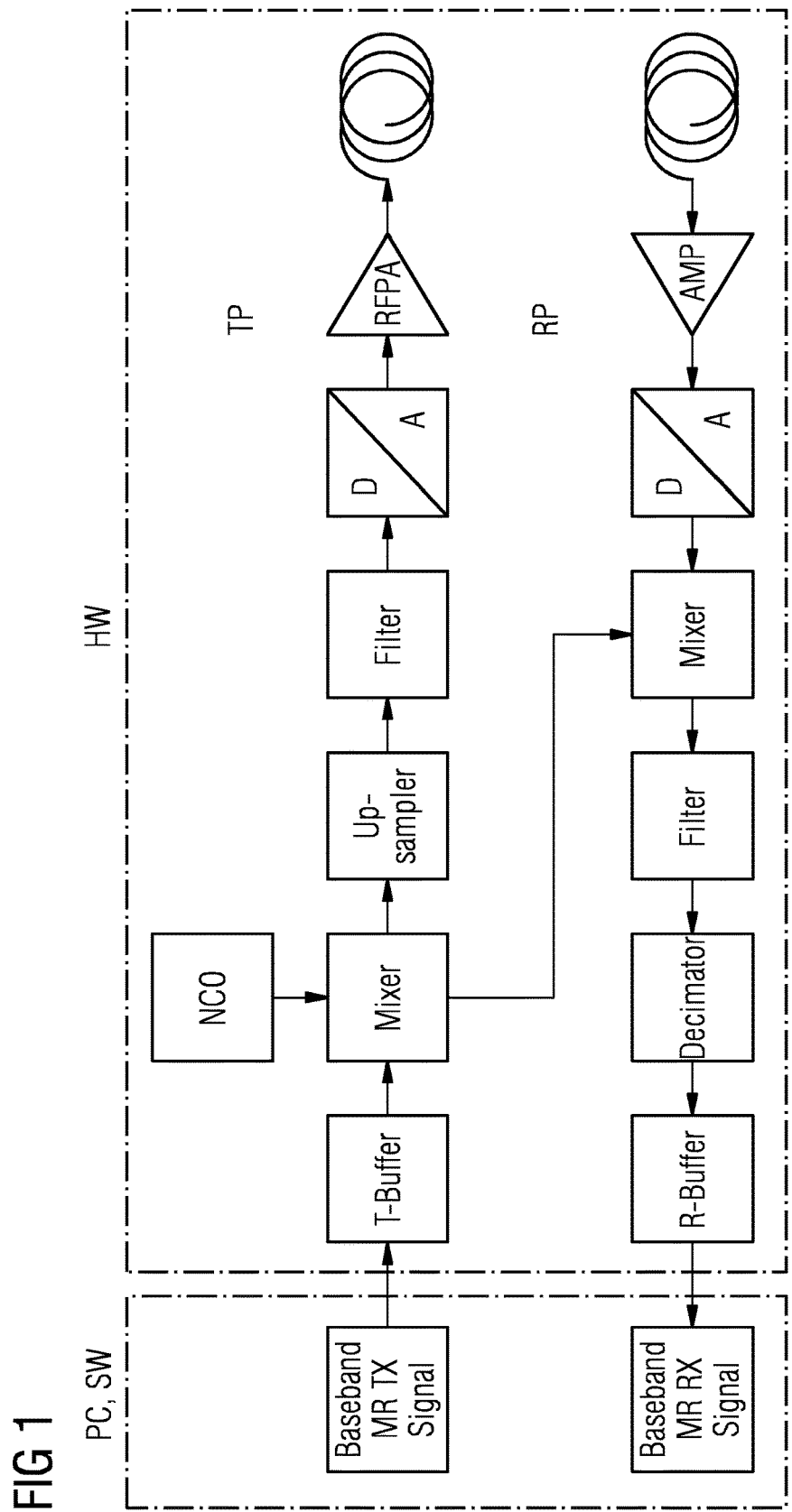
FIG. 1 shows a schematic and simplified illustration of signal paths of a magnetic resonance tomography device in accordance with one example.

FIG. 1 shows the schematic signal path of an MR system having one transmit path TP (as shown, by way of example) or several parallel transmit paths TP, having one receive path RP (as shown, by way of example) or several parallel receive paths RP, and having signal processing in the signal path in the form of digital and analog hardware HW.

Coherence between the transmit and receive channels of a magnetic resonance tomography device may be ensured on a number of levels.

For instance, the modulation signal provided by a clock generator, like the Numeric Control Oscillator NCO in this example (in this case, signal also stands below for instance in general for a signal pattern of numerous individual signals) is identical for all transmit channels TP and receive channels RP, or is replicated identically. Moreover the clock systems for transmit and receive systems TP, RP of a magnetic resonance device 101 are to be synchronous. Furthermore, the temporally exact embodiment (or transmission) of the transmit signal and the synchronous windowing of all receive signals is to be provided (e.g., ensured) via a precise time control.

The plurality of coherence and synchronization aspects may lead to a complex system.

Moreover, the implementation of larger parts of the signal chain as hardware compared with software (according to FIG. 2) may lead to, for example, difficulties when maintaining and updating the systems in the field, difficulties when localizing failures (as a result of, at best, merely restricted log-mechanisms), increased costs due to dedicated hardware, and problems with an obsolescence of components and assemblies.

Figure 2:
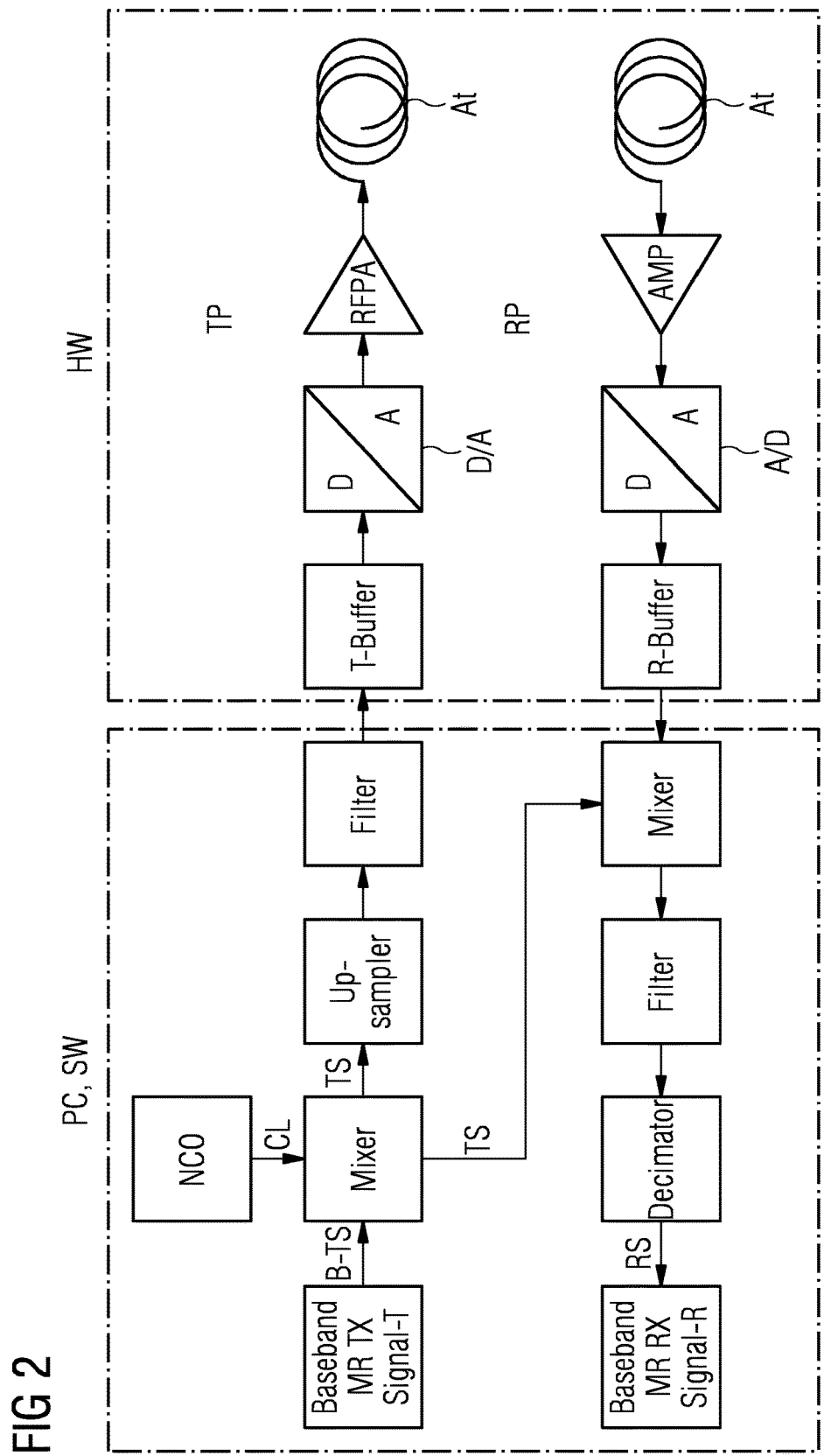
FIG. 2 shows a schematic and simplified illustration of signal paths of a magnetic resonance tomography device according to one embodiment.

FIG. 2 shows a transfer of functional blocks according to one embodiment. In contrast with the arrangement shown in FIG. 1, hardware functions in the signal processing in the signal chain of a magnetic resonance tomography device 101 are transferred into software (SW) or into a computer (PC). The computer may include a memory in which computer-readable instructions are stored, and a processor configured by the computer-readable instructions to implement the signal processing of the functional blocks.

In such cases, a transmit path TP and receive path RP of a magnetic resonance tomography device 101 shown schematically and simplified in FIG. 2 include the following elements. A clock generator like the Numerical Controlled Oscillator NCO generates a clock signal CL, which is used for transmit paths TP and/or receive paths RP of the magnetic resonance device 101.

In (at least one) transmit path TP (in the upper half in FIG. 2), a base band transmit signal B-TS (e.g., in other words RF pulse) is generated with an MRT (base) signal generation unit ("baseband MR TX signal-T") in a computer like, e.g., a personal computer ("PC"), e.g. a PC corresponding to 110 and/or 120 in FIG. 3, and/or with software SW in a computer PC and in a mix element ("mixer") a transmit signal TS is generated with the aid of the clock signal CL generated by the Numerical Controlled Oscillator NCO and the baseband transmit signal B-TS generated by the module "baseband MR TX signal-T". The transmit signal TS is brought to a higher sampling range in an upsampler module ("upsampler"), filtered with a filter unit ("filter"), buffered in a buffer ("T-buffer"), digital-analog converted in a digital-analog converter ("D/A"), and amplified with a transmit signal amplifier RFPA and transmitted with (at least) one antenna At (of a body coil or local coil).

In (at least one) receive path TP (in the lower half in FIG. 2), a signal received with (at least) one antenna AT (from a body 105 in the Field of View FOV of a magnetic resonance device 101) is amplified with a receive signal amplifier AMP, analog-digital converted with an analog-digital converter (A/D), and buffered in a buffer (R-buffer). The buffered signal is then synchronized in a computer like, e.g., a PC (e.g., a PC according to 110 and/or 120 in FIG. 3) and/or with software SW in a computer PC with a mixer controlled by a clock signal (CL or TS) to the transmit signal, filtered with a filter unit ("filter") and brought to a lower sampling rate with a downsampler module ("decimator") and further processed in a receive signal further processing unit ("baseband MR TX signal-R"), e.g., to generate MRT images.

A transfer of traditional hardware functions HW in a computer PC or software SW, which is executed on a generic computer PC, may result in the above-described problems being solved and provide for a reduction in system complexity.

The receive data RS received with an antenna At may be marked with a piece of time information for reproducing the coherence (in other words, e.g., the time difference or the reproducibility of the temporal relationship or the causal association) between in each case a signal in the transmit signal B-TS and/or TS and in each case a signal in the receive signal RS.

One possibility is the multiplexing of a coherent time stamp in the receive data flow. This may however in turn involve coherent clocks on all A/D converters and the logic that generates the time stamp and is incorporated in the receive data flow.

Alternatively, the coherence of the clocks in the receive path RP may be dispensed with, and instead the MR receive signal RS with the receive path RP and also the (if warranted, suitably attenuated) transmit signal TS may be recorded. The transmit signal TS intrinsically delivers the coherence information for the receive signal RS. This may be calculated in the processing software (SW) with phase-sensitive methods of signal processing.

All delays between the transmit system TP and receive system RP are acquired here, similarly to the phase differences of the clocks on the ADC (D/A, A/D). Delays on a signal path have an equal effect on the transmit/receive system in a receive channel-specific fashion.

Alternatively the pulse center (of transmit signals and/or receive signals) may also be defined by amplitude-sensitive methods. This may be achieved with rectangular pulses, but however also with other pulse forms. Because of the known periodic time of the receive clock, a suitable time signal is thus available.

A suitable attenuation of the transmit signal TS for reception purposes is to have a reproducible phase relationship with the normal receive signal RS. This may occur by detuning, damping or/and using a dedicated receive coil, which is multiplexed for the transmit duration with the normal receive coil (At, 106).

High cost savings may be provided because of transfers of functions of entire assemblies in the software. Flexibility may be increased with the care and upgrade of systems in the field. Debugging and logging may be simplified. Operating data may be generated during operation. The obsolescence problem may be reduced. The MTBF (=mean time between failures) may be improved.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A magnetic resonance tomography system comprising:
    a computer comprising:
        a memory in which computer-readable instructions are stored;
        a processor configured by the computer-readable instructions to implement signal processing of transmit signals and receive signals; and
        a mixer, an upsampler, a decimator, a filter, or any combination thereof configured for the signal processing of the transmit signals and the receive signals with the memory and the processor,
    wherein the processor is configured by the computer-readable instructions to establish coherence between a transmit signal and a receive signal by sampling the transmit signal by a temporal relation of the receive signal relative to the transmit signal via a time stamp in data representing the receive signal,
    wherein the computer is configured to generate a magnetic resonance tomography image using the receive signal determining a phase relationship from the time stamp data, and
    wherein the magnetic resonance tomography system is configured to store or display the generated magnetic resonance tomography image.

2. The magnetic resonance tomography system of claim 1, wherein the processor is configured by the computer-readable instructions to implement the upsampler for the signal processing of the transmit signals.

3. The magnetic resonance tomography system of claim 1, wherein the processor is configured by the computer-readable instructions to implement the decimator for the signal processing of the receive signals.

4. The magnetic resonance tomography system of claim 1, wherein the processor is configured by the computer-readable instructions to implement the filter for the signal processing of the transmit signals, the receive signals, or both the transmit and receive signals.

5. The magnetic resonance tomography system of claim 1, wherein the processor is configured by the computer-readable instructions to implement the mixer for the signal processing of the transmit signals, the receive signals, or both the transmit and receive signals.

6. The magnetic resonance tomography system of claim 1, wherein the magnetic resonance tomography system is configured to record the receive signal in a receive path and the transmit signal, and to implement phase-sensitive methods of signal processing to calculate coherence information for the receive signal from the transmit signal.

7. A method for signal processing in a magnetic resonance tomography system, the method comprising:
    signal processing, by a computer of the magnetic resonance tomography system, transmit signals and receive signals, wherein the signal processing is configured to implement a mixer, an upsampler, a decimator, a filter, or any combination thereof, and wherein the signal processing comprises sampling a transmit signal by a temporal relation of a receive signal relative to the transmit signal via a time stamp in data representing the receive signal, therein establishing coherence between the transmit signal and the receive signal;
    generating, by the computer, a magnetic resonance tomography image using the processed receive signal determining a phase relationship from the time stamp data; and
    storing or displaying the generated magnetic resonance tomography image.

8. The method of claim 7, wherein implementing the signal processing comprises implementing the upsampler for the signal processing of the transmit signals.

9. The method of claim 7, wherein implementing the signal processing comprises implementing the decimator for the signal processing of the receive signals.

10. The method of claim 7, wherein implementing the signal processing comprises implementing the filter for the signal processing of the transmit signals, the receive signals, or both the transmit and receive signals.

11. The method of claim 7, wherein implementing the signal processing comprises implementing the mixer for the signal processing of the transmit signals, the receive signals, or both the transmit and receive signals.

12. The method of claim 7, further comprising:
    recording the receive signal and the transmit signal in a receive path of the magnetic resonance tomography system; and
    calculating coherence information for the receive signal from the transmit signal with phase-sensitive methods of signal processing.

13. A magnetic resonance tomography system comprising:
    a computer comprising:
        a memory in which computer-readable instructions are stored;
        a processor configured by the computer-readable instructions to implement signal processing of transmit signals and receive signals;
        a first mixer configured to generate a transmit signal;

an upsampler configured to convert the transmit signal to a higher sampling range;
a first filter configured to filter the upsampled transmit signal;
a second mixer configured to synchronize a signal received from hardware of the magnetic resonance tomography system and a transmit signal received from the first mixer;
a second filter configured to filter the synchronized signal from the second mixer; and
a decimator configured to downsample the filtered signal from the second filter to a lower sampling range,
wherein the computer is configured to process the downsampled signal to generate a magnetic resonance tomography image.

* * * * *